US006802728B1

(12) United States Patent
Howell et al.

(10) Patent No.: US 6,802,728 B1
(45) Date of Patent: Oct. 12, 2004

(54) SOCKET CONNECTOR HAVING EJECTING MECHANISM

(75) Inventors: David G. Howell, Gilbert, AZ (US); Ming-Lun Szu, Tu-Chen (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/641,493

(22) Filed: Aug. 14, 2003

(51) Int. Cl.$^7$ ............................................. H01R 13/62
(52) U.S. Cl. ...................................................... 439/160
(58) Field of Search ........................ 439/160, 66, 157, 439/71, 79

(56) References Cited

U.S. PATENT DOCUMENTS

| | | | | |
|---|---|---|---|---|
| 4,973,255 A | * | 11/1990 | Rudoy | 439/157 |
| 5,057,029 A | * | 10/1991 | Noorily | 439/160 |
| 5,073,116 A | * | 12/1991 | Beck, Jr. | 439/71 |
| 5,302,133 A | * | 4/1994 | Tondreault | 439/157 |
| 5,380,213 A | * | 1/1995 | Piorunneck et al. | 439/160 |
| 6,146,152 A | | 11/2000 | McHugh et al. | |
| 6,164,978 A | | 12/2000 | McHugh et al. | |
| 6,179,624 B1 | | 1/2001 | McHugh et al. | |
| 6,186,797 B1 | | 2/2001 | Wang et al. | |
| 6,203,331 B1 | | 3/2001 | McHugh et al. | |
| 6,561,817 B1 | * | 5/2003 | Ma | 439/66 |
| 6,561,818 B1 | * | 5/2003 | Howell et al. | 439/66 |
| 6,731,516 B1 | * | 5/2004 | Ma | 361/802 |
| 6,733,304 B1 | * | 5/2004 | Liao | 439/66 |

* cited by examiner

Primary Examiner—Ross Gushi
Assistant Examiner—Phuongchi Nguyen
(74) Attorney, Agent, or Firm—Wei Te Chung

(57) ABSTRACT

A socket connector (10) includes an insulative housing (12), a plurality of contacts (14) received in the housing, and an ejector (14) pivotally connected with the housing. The injector includes a pivot axle (160) pivotally received in the housing, a lever (162) extending from the pivot axle, a transverse pressing button (162) extending from a distal end of the lever perpendicularly, and an injecting portion (166) extending from the pivot axle in a direction substantially perpendicular to the lever. When an IC module (20) is received in the housing, the ejecting portion of the ejector is pressed under the IC module. When the IC module is required to be removed from the housing, the pressing button of the ejector is pressed down, and the ejecting portion rotates about the pivot axle and pushes the IC module upwardly. Thus, the IC module can be removed from the housing easily.

16 Claims, 6 Drawing Sheets

SOCKET CONNECTOR HAVING EJECTING MECHANISM

BACKGROUND OF THE INVENTION

1. Field of the Invention

The present invention relates to a socket connector having an ejector for easily removing an integrated circuit (IC) module received in the socket connector.

2. Description of the Prior Art

A conventional socket connector for carrying a land grid array (LGA) IC module usually defines restricting fingers for resiliently retaining the IC module in the socket connector. Examples of such socket connectors are disclosed in U.S. Pat. Nos. 6,146,152, 6,186,797, 6,164,978, 6,203,331 and 6,179,624.

FIG. 6 shows a conventional socket connector 6 as disclosed in U.S. Pat. No. 6,146,152. The socket connector 6 provides a recessed area 63 to receive an LGA IC module 7 thereon. The recessed area 63 defines a plurality of passageways 60, and each passageway 60 accommodates a conductive contact 8 therein. The socket connector 6 has a pair of push fingers 611 on two adjacent sides 61 thereof respectively. Each push finger 611 comprises a spring portion 6111 extending from the side 61, and a restricting portion 6112 extending from the distal end of the spring portion 6111 and protruding into a space above the recessed area 63. Thus, the restricting portion 6112 projects beyond an inner edge of the side 61. When the IC module 7 is received on the recessed area 63, the push fingers 611 retain the IC module 7 in the correct position. However, if the IC module 7 is required to be removed from the recessed area 63 for replacement or maintenance, this is difficult because of the confined spaces in and around the socket connector 6. A conventional method is to pull the push fingers 611 away from the recessed area 63 to release the IC module 7. However, this is liable to break the push fingers 611 and damage the restricting mechanism of the socket connector 6.

Hence, a new socket connector which overcomes the above-described disadvantages is desired.

SUMMARY OF THE INVENTION

Accordingly, a primary object of the present invention is to provide a socket connector having an ejector for easily removing an IC module received in the socket connector.

In order to achieve the above mentioned object, a socket connector in accordance with a preferred embodiment of the present invention comprises an insulative housing mounted on a printed circuit board (PCB), a plurality of contacts received in the housing, and an ejector pivotally jointed with the housing. The ejector comprises a pivot axle pivotally received in the housing, a lever extending from a middle portion of the pivot axle, a transverse pressing button extending from a distal end of the lever perpendicularly, and an ejecting portion extending from the middle portion of the axle in a direction substantially perpendicular to the lever. When the IC module is received in the housing, the ejecting portion of the ejector is suppressed under the IC module. When the IC module is required to be removed from the housing, the pressing button of the ejector is pressed down and, as a result, the ejecting portion rotates about the pivot axle and finally pushes the IC module upwardly. Thus, the IC module is removed from the housing easily.

Other objects, advantages and novel features of the present invention will become more apparent from the following detailed description when taken in conjunction with the accompanying drawings, in which:

DESCRIPTION OF THE PREFERRED EMBODIMENTS

Figure 1:
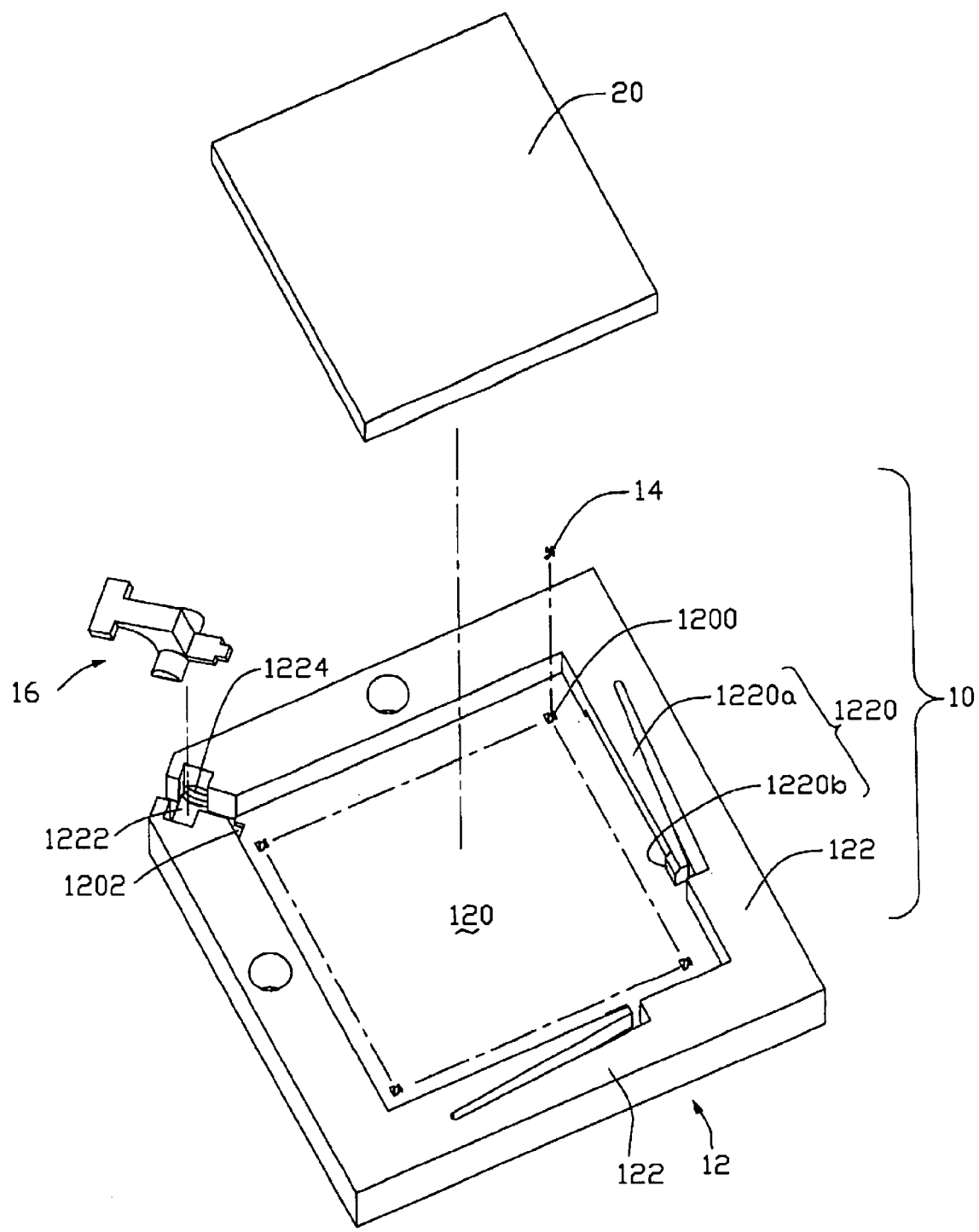
FIG. 1 is a simplified, exploded, isometric view of a socket connector in accordance with the preferred embodiment of the present invention, and showing an IC module ready to be received in the socket connector.

Reference will now be made to the drawing figures to describe the present invention in detail.

Figure 2:
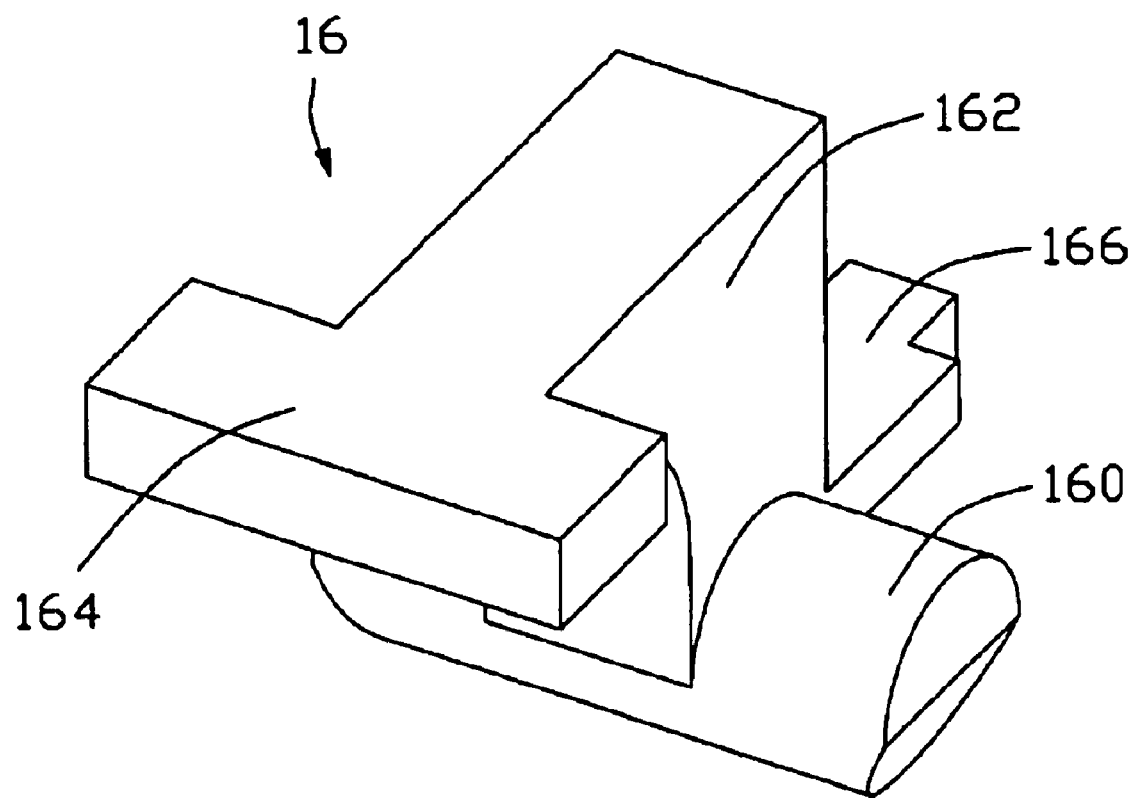
FIG. 2 is an enlarged, isometric view of an ejector of the socket connector of FIG. 1, viewed from another aspect.
Figure 3:
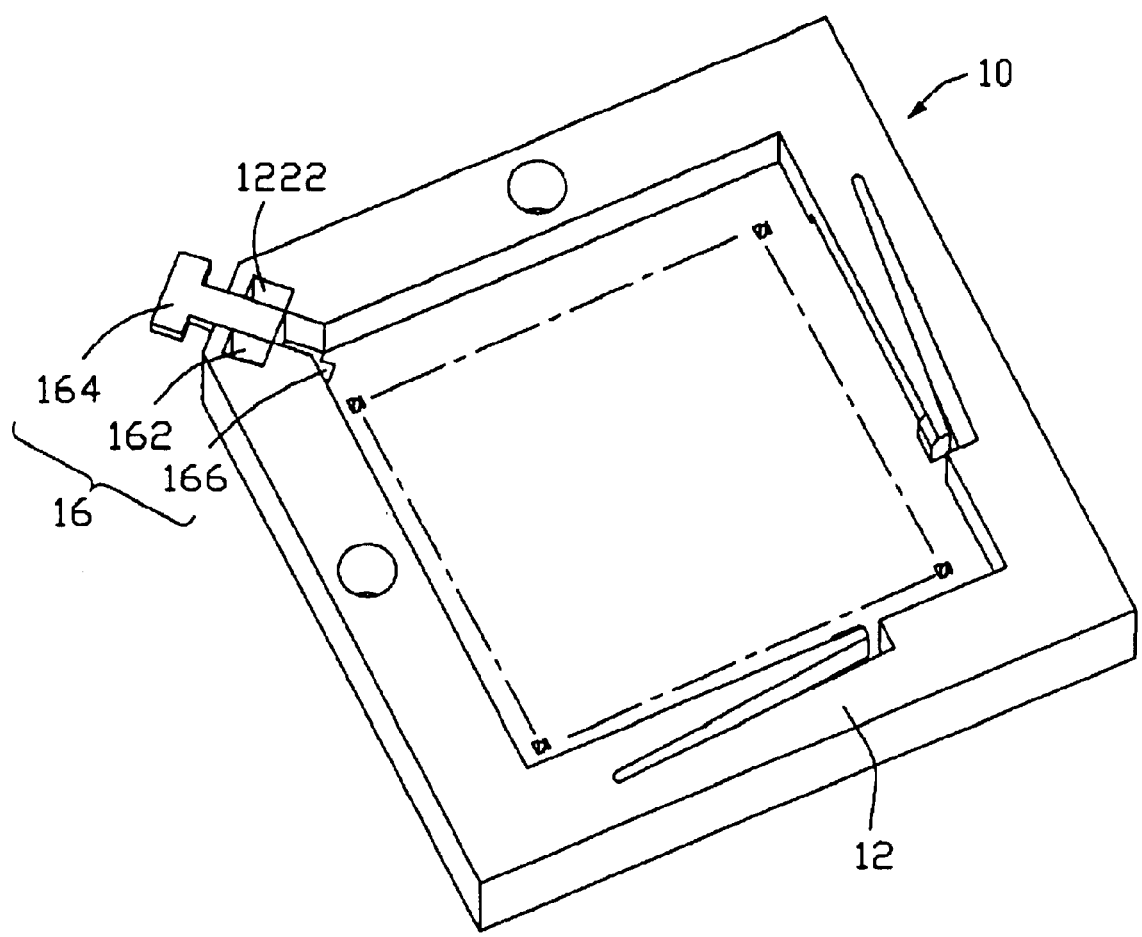
FIG. 3 is an assembled view of the socket connector of FIG. 1.

Referring to FIGS. 1–3, a socket connector IO in accordance with the preferred embodiment of the present invention is adapted to electrically connect an IC module 20 to a PCB (not shown). The socket connector 10 comprises an insulative housing 12, a plurality of conductive contacts 14 received in the housing 12, and an ejector 16 pivotally connected with the housing 12. The housing 12 comprises a recessed area 120 defining a plurality of passageways 1200 for receiving the contacts 14 therein, and two pairs of sidewalls 122 adjoining the recessed area 120. The housing 12 further comprises a pair of push fingers 1220 in two adjacent of the sidewalls 122 respectively. Each push finger 1220 comprises a spring portion 1220a extending from the sidewall 122, and a restricting portion 1220b extending from the distal end of the spring portion 1220a and protruding into a space above the recessed area 120. Thus, the restricting portion 1220b projects beyond an inner face of the sidewall 122. The housing 12 defines a pivot slot 1222 in a junction of the other two adjacent sidewalls 122. The pivot slot 1222 comprises two opposite supporting recesses 1224. The housing 12 further defines a receiving slot 1202 in a corner of the recessed area 120 at said junction of the other two adjacent sidewalls 122, the receiving slot 1202 being in communication with the pivot slot 1222.

The ejector 16 comprises a pivot axle 160, a lever 162 extending from a middle of the pivot axle 162, a transverse pressing button 164 extending from a distal end of the lever 162, and an ejecting portion 166 extending from the middle of the pivot axle 160 in a direction substantially perpendicular to the lever 162. The pivot axle 160 of the ejector 16 is pivotably received in the pivot slot 1222, and is supported in the supporting recesses 1224. Thus, the ejector 16 can rotate about the pivot axle 160 in the pivot slot 1222. The ejecting portion 166 is disposed no higher than an upper surface of the recessed area 120.

Figure 4:
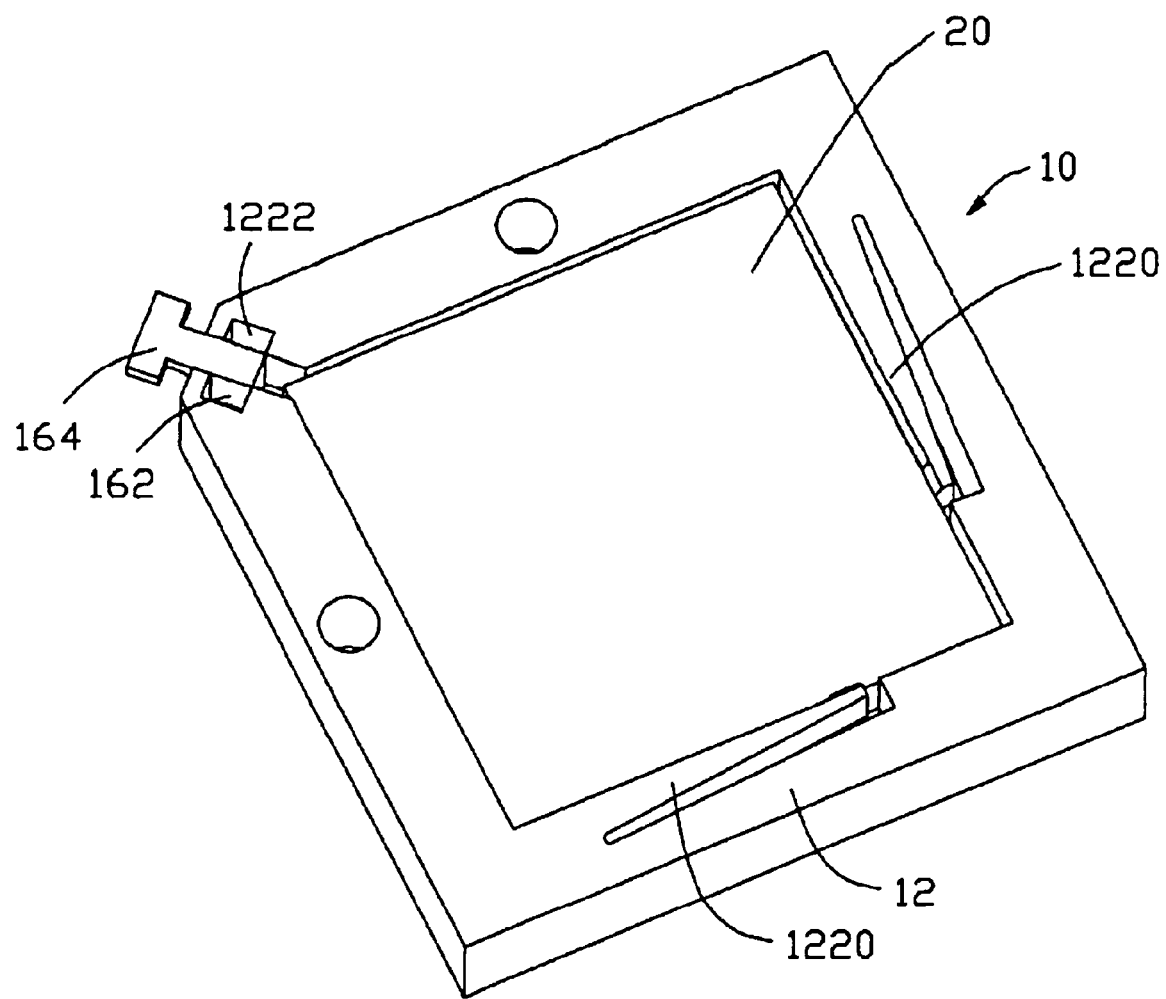
FIG. 4 is similar to FIG. 3, but showing the IC module of FIG. 1 received in the socket connector.
Figure 5:
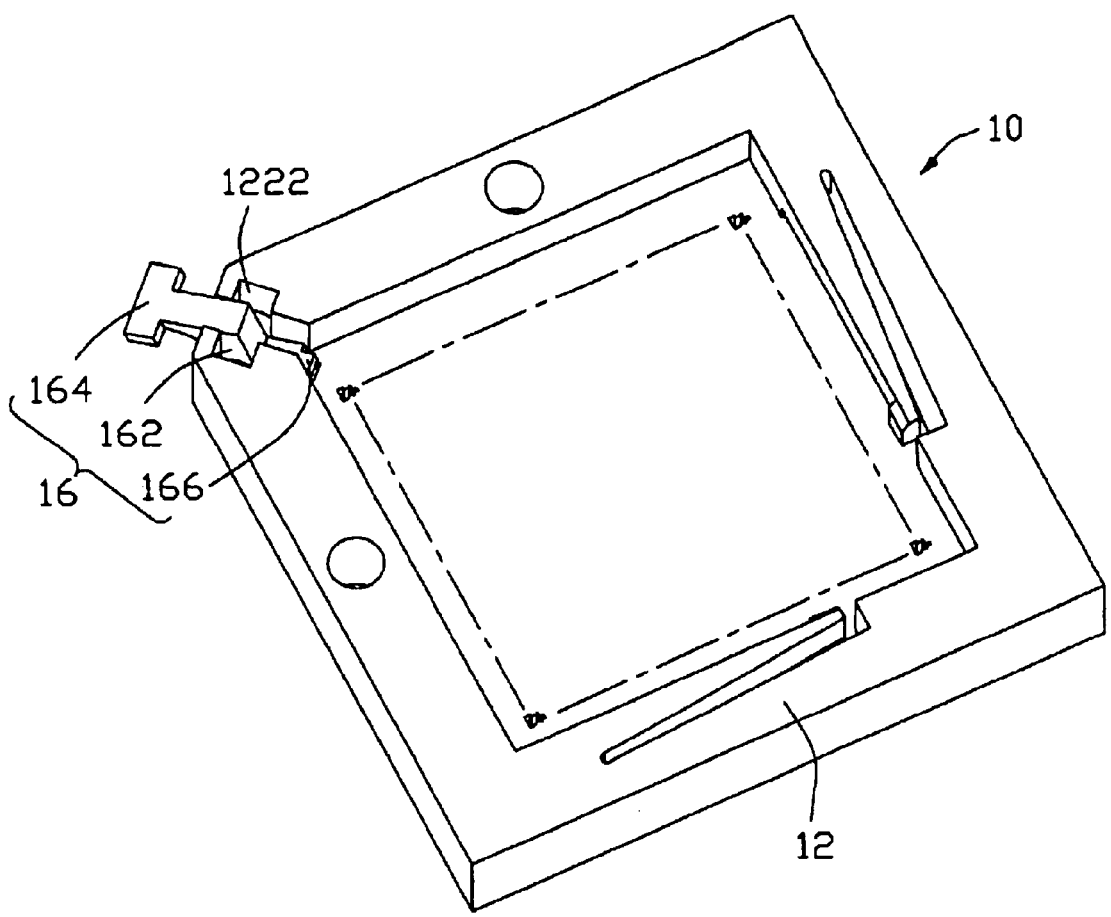
FIG. 5 is similar to FIG. 3, but showing a position of the ejector of the socket connector when the ejector is operated.
Figure 6:
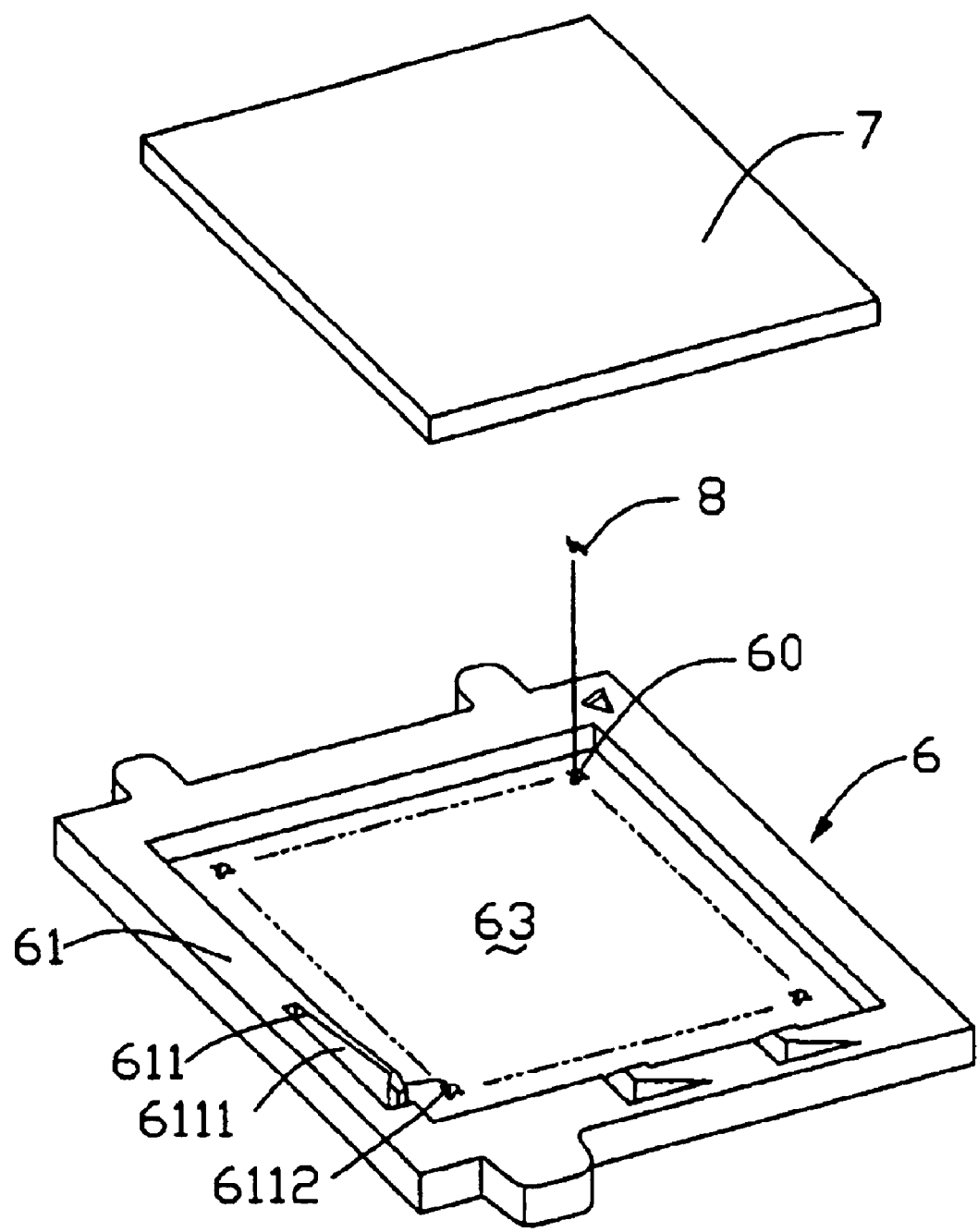
FIG. 6 is a simplified, isometric view of a conventional socket connector, and showing an IC module ready be received in the socket connector.

Referring to FIGS. 4–5, when the IC module 20 is received in the space above the recessed area 120, the push fingers 1220 resiliently retain the IC module 20 in a correct position. The ejecting portion 166 of the ejector 16 is pressed completely into the receiving slot 1202 by the IC module 20.

When the IC module 20 is required to be removed from the housing 12, the pressing button 164 of the ejector 16 is pressed down, and as a result, the ejecting portion 166 rotates about the pivot axle 160 and pushes the IC module 20 upwardly. The IC module 20 is then easily removed from the housing 12.

It is noted that the two push fingers provides respectively forces and obtain a resultant force directing toward the corer where the ejector is located preferably. Understandably, the corner of the housing may provide the sufficient space and relatively strong structure to hold the ejector. On the other hand, the corner of the IC module may provide relatively greater area than other edge sections thereof so as to efficiently engage the ejection portion of the ejector. Moreover, the ejector may be moved either curvedly via the curved guiding groove, linearly or translationally via the proper guiding device, or of other combination types instead of pure pivotally. Additionally, if required, a locking portion may be optionally formed on a top portion of the ejector for downwardly restraining the IC module in the socket when said ejector is in the non-ejection state, wherein such a dual function ejector, i.e., locking and ejecting, may look like the ejector used in the DIMM (Dual In-line Memory Module) connector as shown in U.S. Pat. No. 5,634,803. Yet, the side walls 122 of the housing 12 may not be integrally formed with the recessed area 120 for manufacturing consideration.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. A socket connector for electrically connecting an integrated circuit module to a printed circuit board comprising:
    an insulative housing defining two pairs of sidewalls, said sidewalls forming a recessed area defining a plurality of passageways therein;
    a plurality of conductive contacts received in corresponding passageways; and
    an ejector, partially and pivotally received in the sidewalls of the housing, comprising a pivot axle, an ejecting portion extending from the pivot axle and a pressing button extending from the pivot axle, the ejecting portion being disposed lower than an upper surface of the recessed area;
    wherein the housing further defines a pivot slot in the junction of two adjacent sidewalls for receiving ejector.

2. The socket connector as described in claim 1, wherein the ejector further defines a lever connecting the pressing button and the pivot axle, and the pressing button is substantially perpendicular to the lever.

3. The socket connector as described in claim 1, wherein the pivot slot of the housing forms two opposite supporting recesses for supporting the pivot axle.

4. The socket connector as described in claim 1, wherein the housing further defines a receiving slot in the peripheral portion of the recessed area, the receiving slot being adapted to receive the ejecting portion.

5. The socket connector as described in claim 1, wherein the sidewalls defining a plurality of push fingers for restricting the integrated circuit module in the correct position.

6. A socket connector comprising:
    an insulative housing defining an upward mating face for mating an IC module;
    a plurality of contacts disposed in the housing; and
    an ejector located on a position of a periphery of said housing and moveable relative to the housing, said ejector defining an ejection portion; wherein
    said ejection portion is located essentially below the mating face when said ejector is in a first position while at least a portion of said ejection portion is upwardly moved above said mating face when said ejector is in a second position;
    wherein said housing is polygonal;
    wherein said ejector is located at a corner of the housing.

7. The socket connector as described in claim 6, wherein said ejector is pivotally moved relative to the housing.

8. The socket connector as described in claim 6, wherein said housing is rectangular.

9. The socket connector as described in claim 6, wherein said housing defines a plurality of raised side walls, and said mating face is downwardly recessed relative to said side walls.

10. The socket connector as described in claim 9, wherein at least one push finger is formed on at least one of said side walls.

11. The socket connector as described in claim 6, wherein at least one push finger is formed on at least one side of the periphery of the housing.

12. The socket connector as described in claim 11, wherein the ejector is located at the position where a resultant force, due to said at least one push finger and adapted to be applied unto the IC module, directs toward.

13. The socket connector as described in claim 12, wherein there are two push fingers located on two sides of the periphery of housing, and said ejector is located at a corner where the resultant force, due to said two push fingers and adapted to be applied to the IC module, directs toward.

14. A socket connector assembly comprising:
    an insulative housing defining an upward first mating face;
    an IC module seated upon said first mating face and defining a downward second mating face facing to the first mating face;
    a plurality of contacts disposed in the housing; and
    an ejector located on a position of a periphery of said housing and moveable relative to the housing, said ejector defining an ejection portion; wherein
    said ejection portion is located essentially below the second mating face when said ejector is in a first position where the IC module is retained relative to the housing, while at least a portion of said ejection portion is upwardly moved above said first mating face and engages the second mating face to urge the IC module to upwardly move when said ejector is in a second position where the IC module is ejected away from the housing;
    wherein said ejector is located at a corner of said housing.

15. The assembly as described in claim 14, wherein said housing further includes at least one push finger on at least one side of the periphery of the housing.

16. The assembly as described in claim 15, wherein said ejector is located at the position where a resultant force, due to said at least one push finger and applied unto the IC module, directs toward.

* * * * *